United States Patent [19]
Larsen et al.

[11] Patent Number: 5,352,618
[45] Date of Patent: Oct. 4, 1994

[54] METHOD FOR FORMING THIN TUNNELING WINDOWS IN EEPROMS

[75] Inventors: Bradley J. Larsen, Woodland Park; Donald A. Erickson, Colorado Springs, both of Colo.

[73] Assignee: Atmel Corporation, San Jose, Calif.

[21] Appl. No.: 100,467

[22] Filed: Jul. 30, 1993

[51] Int. Cl.$^5$ .......................................... H01L 21/265
[52] U.S. Cl. ........................................ 437/43; 437/238; 437/241; 437/979; 437/985; 148/DIG. 117; 148/DIG. 163
[58] Field of Search ................... 437/43, 73, 979, 985, 437/238, 241; 148/DIG. 117, DIG. 163

[56] References Cited

U.S. PATENT DOCUMENTS 4,755,477  7/1988  Chao .................................... 437/73
5,236,862  8/1993  Pfiester et al. ..................... 437/73

OTHER PUBLICATIONS

Sung et al., "Reverse L-Shape Sealed Poly-Buffer LOCOS Tech.", IEEE Electron Device Letters, vol. 11, No. 11, pp. 549–551 (1990).
Roth et al., "Characterization of Polysilicon-Encapsulated Local Oxidation", IEEE Transactions on Electron Devices, vol. 39, No. 5, (1992).

Primary Examiner—George Fourson
Assistant Examiner—Richard A. Booth
Attorney, Agent, or Firm—Schneck & McHugh

[57] ABSTRACT

A method for making submicron dielectric windows for electron tunneling between a floating gate and substrate in a semiconductor EEPROM device. A mask edge overlying an oxide layer on a substrate is undercut a small distance, the area surrounding that small distance is built up with oxide, then a thin layer of oxide is formed in the undercut distance to serve as a tunneling window.

11 Claims, 3 Drawing Sheets

METHOD FOR FORMING THIN TUNNELING WINDOWS IN EEPROMS

TECHNICAL FIELD

The present invention relates generally to methods of fabricating a semiconductor non-volatile memory device and more particularly to fabricating thin dielectric windows for electron tunneling in electrically erasable programmable read only memory devices.

BACKGROUND ART

In metal oxide semiconductor (MOS) electrically erasable, programmable read only memory (EEPROM) transistors, electrons tunnel through very thin silicon dioxide ($SiO_2$, "oxide") layers to be stored on or removed from a storage location, known as a floating gate. The electric charge, or lack of electric charge, stored on the floating gate in turn determines whether a transistor controlled by the floating gate can be turned on or off, thereby functioning as a programmable memory cell. More precisely, charge on the floating gate shifts the threshold voltage at which the transistor conducts. At a low threshold voltage, representing an unprogrammed state, designated a digital one, the transistor conducts when selected by a reference voltage applied to a sense gate, a gate above the floating gate. At a higher threshold voltage, representing a programmed state, designated a digital zero, the transistor does not conduct when selected under the same conditions.

The area of the thin dielectric layer through which electron tunneling occurs is limited to small generally rectangular dimensions and the thinness of the layer is carefully controlled. For this reason the rectangular area is termed a "window." Oxide windows having a thickness of between 70 angsttoms to 200 angstroms and an area of one half to several square microns are typical. U.S. Pat. No. 4,590,503 to Harari describes formation of a thin tunnel oxide region.

A silicon substrate that has been doped with ions is located below the floating gate, separated by a dielectric layer. The thin tunnel oxide window dielectric separating the floating gate layer from the substrate provides the region for electrons to tunnel between the substrate and the floating gate.

The area and the thickness of the tunnel oxide window are two of the most important factors in the performance of EEPROM memory cells. For any significant tunneling to occur, the difference in voltage between the floating gate and the substrate must exceed a threshold voltage, the threshold voltage being generally related to the both the area and thickness of the tunneling window. The sense gate affects the floating gate through capacitive coupling, and a similar capacitive coupling exists between the floating gate and the substrate. Since the voltage difference between the sense gate and the substrate is the sum of the voltage difference between the floating gate and the substrate and the voltage difference between the floating gate and the sense gate, a lower threshold voltage allows a lower voltage to be applied between the sense gate and the substrate for charging and discharging. Alternatively, a lower threshold voltage allows the memory cell to be charged or discharged more quickly, entailing a higher tunneling current.

A smaller tunneling window area is advantageous in at least three ways. First, as explained above, a smaller window allows the memory cell to be read or written either with a lower applied voltage or more quickly, or both. Each of these possibilities offers user benefits, such as an increase in programming speed or a reduction in energy consumption. Second, a smaller window area allows the cell and the whole transistor circuit to be made smaller, and the resultant scaling down in size of large arrays of such circuits has the benefits of packing more information capabilities in a smaller package. Thus a smaller tunneling window offers the promise of better performance and more memory in a smaller package. Third, a smaller window area allows the possibility of lowering write and erase voltages.

The tunnel oxide window is typically produced during the fabrication of the EEPROM by the deposition of layers and etching by conventional photoresist techniques. As the area of tunnel oxide windows approaches and even becomes smaller than the resolution of the photoresist patterning and etching, conventional photoresist techniques present a limit to the size that these windows can be accurately made.

It is therefore an object of the present invention to provide a method for forming submicron area tunnel oxide windows that are not restricted by the limits inherent in conventional photoresist and etching processes, or by the limits of lithography.

DISCLOSURE OF THE INVENTION

In the present invention a submicron area tunnel window is made in an EEPROM by forming a pattern for the window to dimensions smaller than that permitted by the limits of lithography. The window is formed by undercutting a precise amount of an end of a nitride layer that has been etched by conventional photoresist techniques, and subsequently depositing and etching layers to form that small undercut area into a dielectric window.

This is achieved by depositing a thin oxide layer, approximately 500 angstroms in thickness, on top of a silicon substrate which has been or can be implanted with ions in spots to form regions of enhanced charge for forming source and drain electrodes, and which also has been grown with field oxide boundaries separating enhanced charge regions. The field oxide forms borders between memory cells. The following discussion thus focuses on the area between the field boundaries.

A thin silicon nitride, i.e. $Si_3N_4$, "nitride", layer approximately 1000 angstroms in thickness is deposited on the oxide layer. The nitride layer is then masked and etched so that, for each pair of memory cells to be formed, only a plateau shaped nitride layer remains, two opposite ends of the plateau located approximately above the eventual location of two tunnel oxide windows.

If a self aligned, to the tunnel, buried N+ region is desired, it may be added at this point by ion implantation bombardment near the ends of the nitride plateau.

The oxide layer is then wet etched with buffered hydrofluoric acid or any other oxide etch that does not damage the silicon substrate, removing not only the oxide that is not covered by the plateau, but also etching slightly under the ends of the plateau a precise amount which may be a thousand to several thousand angsttoms, exposing the substrate where the oxide has been etched away. The amount of this undercut will determine the size of the tunnel oxide window.

Next, an oxide layer much thinner than the original oxide layer, approximately 100 angstroms, is grown on the substrate, including the area of the substrate lying under the ends of the nitride plateau. A layer of nitride, approximately 400 angstroms thick, is then deposited using low pressure chemical vapor deposition techniques, causing the space beneath the nitride ends and above the oxide layer to be filled in with nitride. Then a blanket nitride etch that removes about 500 angstroms is applied. This will leave intact most of the nitride filling in the space beneath the nitride ends and above the oxide layer, as it is protected from etching by the approximately 400 Angstrom layer of nitride. A layer of oxide is then grown on the approximately 100 angstrom thick layer of oxide not covered by the nitride, forming a single layer of oxide approximately 700 angsttoms in thickness.

The nitride is then stripped off, leaving only the substrate blanketed by three layers of oxide: the approximately 500 angstrom thick layer that was not covered by nitride, the approximately 500 angstrom thick layer that has been under the nitride plateau and has never been etched, and between those layers the approximately 100 angstrom thick layer that was under the ends of the nitride plateau. A buffered wet oxide etch is applied that removes approximately 120 angstroms of oxide, including all of the approximately 100 angstrom thick layer that was under the ends of the nitride plateau. An approximately 80 angstrom thick layer of oxide is then grown. This thin layer, where it is grown on the small area of exposed substrate that formerly was under the ends of the nitride plateau, is to become the tunneling window.

A conventional EEPROM fabrication process is then followed, beginning with the deposit of a polycrystalline silicon layer that is to become the floating gate. A bottom surface of a gate made of this layer can be seen to be separated from the substrate by several hundred angstroms of oxide, except for the small tunneling window area, which is separated from the substrate by only approximately 80 angstroms of oxide. The field oxide rows provide borders to the tunnel oxide window that may be a thousand to ten thousand angstroms apart. The nitride undercut technique described above has produced a window in a direction perpendicular to that which is of a size one thousand to several thousand angstroms. Thus the tunnel window produced by the present invention may be much less than one square micron in area, by less than one hundred angstroms in thickness.

BEST MODE FOR CARRYING OUT THE INVENTION

Figure 1:
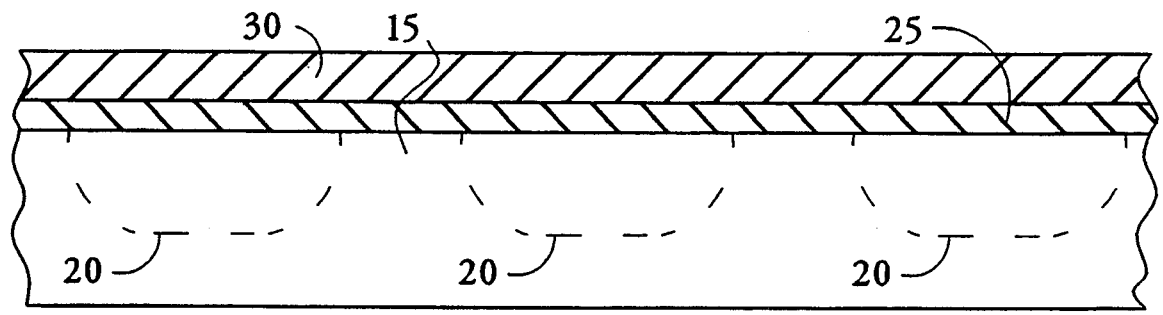
FIG. 1 is a cross-sectional elevation view of a portion of a semiconductor substrate having doped regions under layers of oxide and nitride above the substrate.

Referring now to FIG. 1, a silicon substrate 15 having three buried N+ regions 20 is shown. The N+ regions 20 are formed by conventional methods, such as ion implantation of an N type dopant. Subsurface doped regions are typically used as source and drain electrodes of an MOS transistor. On top of the substrate 15 is a first oxide layer 25 which is approximately 500 angstroms in thickness. Deposited on top of the oxide layer 25 is a first nitride layer 30 which is approximately 1000 angstroms in thickness.

Figure 2:
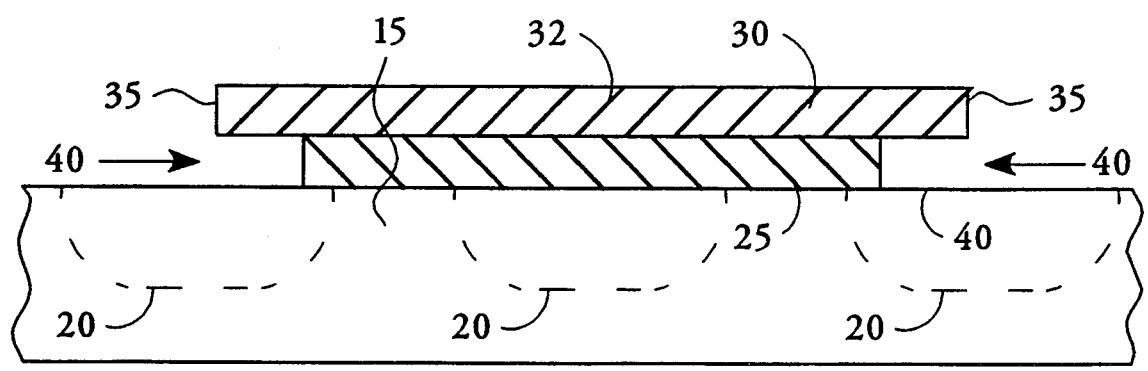
FIG. 2 is a cross-sectional elevation view of the elements of FIG. 1 after the layers have been masked and etched.

FIG. 2 shows the substrate 15, and the oxide layer 25 and nitride layer 30 after etching. The nitride layer 30 has been masked and etched by conventional methods to leave a plateau 32 located above one of the buried N+ regions 20 having ends 35 located above the other two buried N+ regions 20. If a self-aligned (to the tunnel) buried N+ region is desired, it may be formed at this point in this embodiment. For this case there would be no buried N+ regions 20 present in FIG. 1. Before removing the photoresist from the nitride feature 32, an N type dopant is implanted by ion bombardment. This will form the left and right buried regions 20 shown in FIG. 2. The center buried N+ region in FIG. 2 would not be present. A wet oxide etch of hydrofluoric acid or any other chemical known to etch oxide without damaging the silicon substrate has been applied that not only removes all of the oxide layer 25 that not covered by the plateau 32, but also etches undercuts 40 in the oxide layer 25 slightly under the ends 35 of the plateau 32. The amount of these slight undercuts 40 can be accurately controlled by known etching techniques and may be a thousand to several thousand angstroms under the ends 35.

Figure 3:
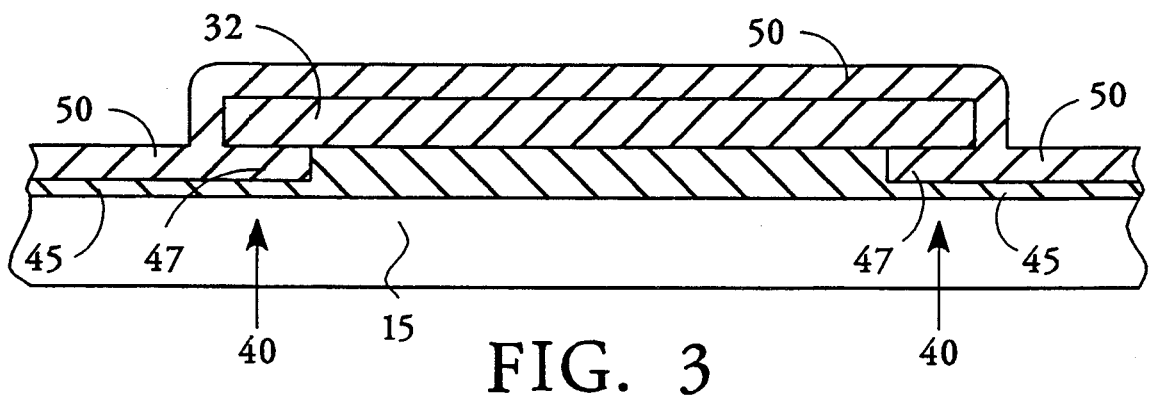
FIG. 3 is a cross-sectional elevation view of the elements of FIG. 2 after a layer of oxide has been grown and a layer of nitride has been deposited.

Referring now to FIG. 3, a thin second layer 45 of oxide is grown next. This oxide layer 45 may be about 100 angstroms in thickness and is formed along the exposed silicon substrate 15 including the undercuts 40, leaving spaces 47 between the ends 35 and the undercuts 40. The oxide layer 45 does not grow on the nitride plateau 32. A blanket second layer 50 of nitride is then deposited that covers the plateau 32, the oxide layer 45 and the undercuts 40, and fills the spaces 47. The nitride layer 50 may be deposited by low pressure chemical vapor deposition and may be approximately 400 angstroms in thickness.

Figure 4:
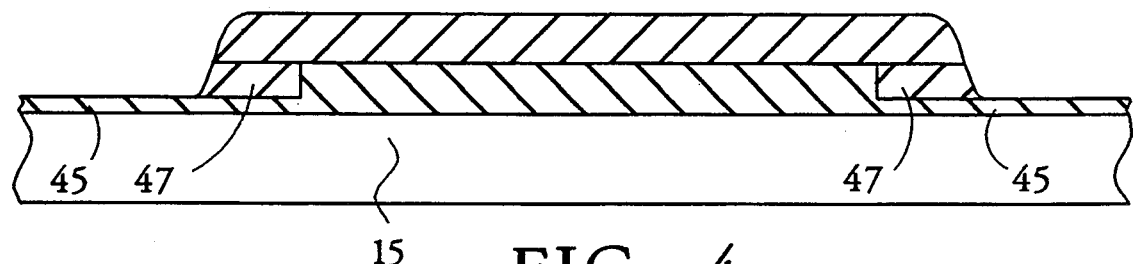
FIG. 4 is a cross-sectional elevation view of the elements of FIG. 3 after a layer of the nitride has been etched away.

Referring now to FIG. 4, a blanket nitride etch is next applied that removes approximately 500 angstroms of nitride, removing substantially all of the nitride layer 50 except that which filled in the spaces 47, which is protected by other parts of layer 50 which are exposed to the etch first.

Figure 5:
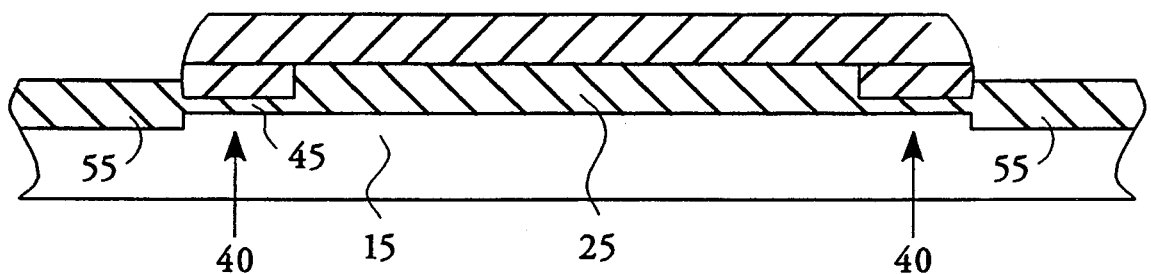
FIG. 5 is a cross-sectional elevation view of the elements of FIG. 4 after a layer of oxide has been grown.

Referring now to FIG. 5, a third layer 55 of oxide is grown on all of the oxide that is not covered by nitride. This oxide layer 55 combines with the second layer 45 of oxide that is not located below a nitride layer and also diffuses into a thin surface layer of the substrate below. The third layer 55 of oxide may be about 700 angstroms in thickness. A top oxide etch is then applied to remove any oxide grown on the nitride features 32 and 47. Next, a nitride strip is applied that removes all of the remaining nitride. Thus, small lengths of the thin second oxide layer 45 from the undercuts 40 are left between the first oxide layer 25 and the third oxide layer 55, both of which are approximately 500 angstroms thick.

Figure 6:
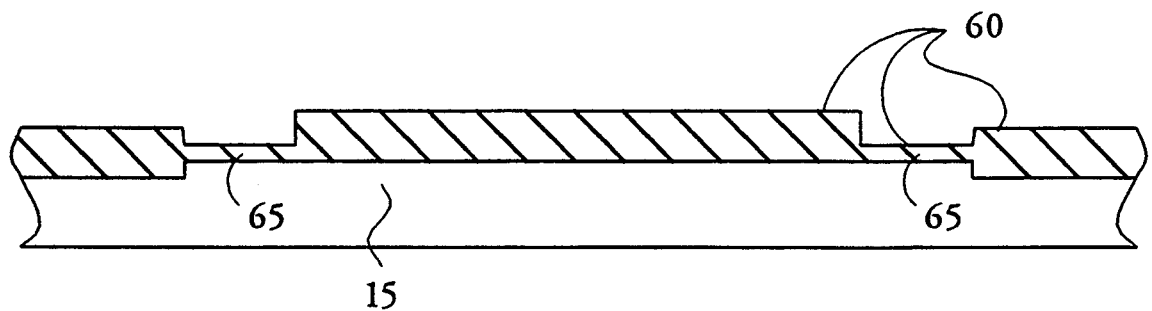
FIG. 6 is a cross-sectional elevation view of the elements of FIG. 5 after the nitride has been stripped away, a layer of oxide has been etched and another layer of oxide has been grown.

Referring now to FIG. 6, a buffered oxide etch which may utilize hydrofluoric acid is applied to remove approximately 120 angstroms of oxide. This removes all of the second oxide layer 45 from the undercut, exposing but not damaging a small area of the substrate 15 between the layers 25 and 55 of oxide. A thin fourth layer 60 of oxide is then grown or deposited on the small exposed area of the substrate 15 and the layers 25 and 55. This layer 60 of oxide may be approximately 80 angstroms in thickness, and becomes a tunnel oxide window 65 where it covers the small area of substrate 15 that had previously been etched of all oxide. At this point, a standard EEPROM process flow would be followed, beginning with the deposition of a first polycrystalline silicon layer to form a floating gate.

Figure 7:
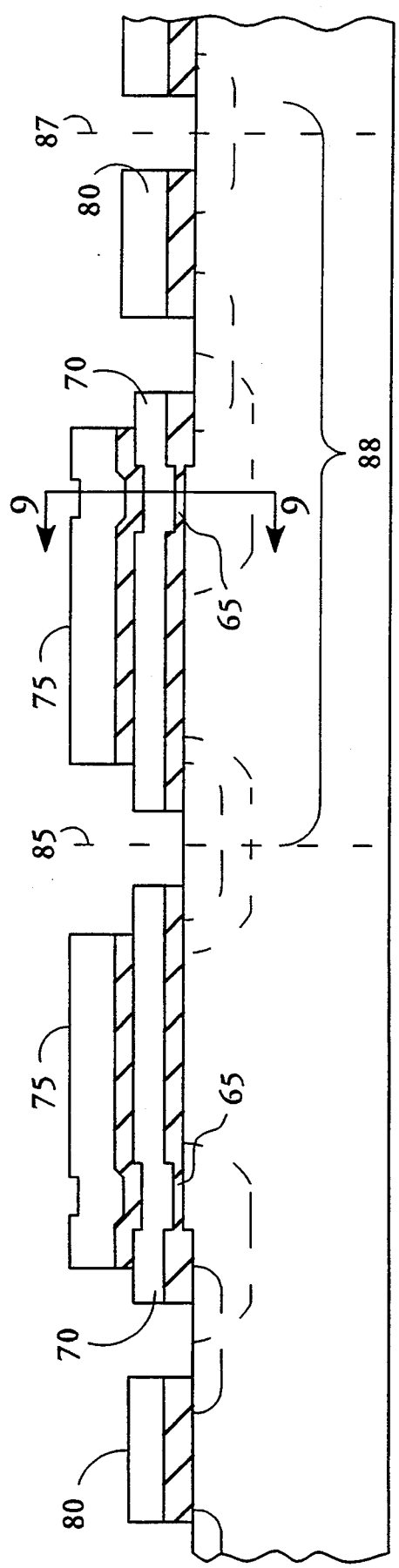
FIG. 7 is a cross-sectional elevation view of an EEPROM device constructed in accordance with this invention.
Figure 8:
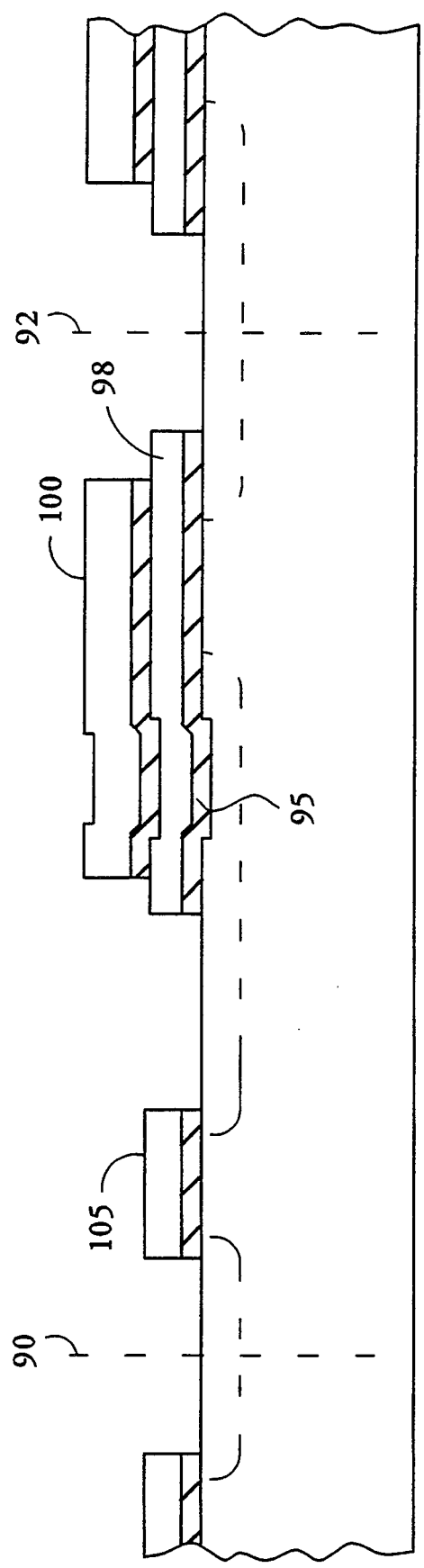
FIG. 8 is a cross-sectional elevation view of a conventional EEPROM device.

Referring now to FIG. 7, an EEPROM cell having tunnel oxide windows 65 formed with the process of the present invention is shown. This EEPROM cell can be seen to have polycrystalline silicon floating gates 70, and sense gates 75 and control gates 80 formed from another polycrystalline silicon deposit. A pair of cells is symmetrical about mirror line 85, and the distance 88 between those lines represents the length of one cell. For comparison, a prior art EEPROM cell is shown ill FIG. 8. The prior art cell, a pair of which is symmetrical about mirror lines 90 and 92, has tunnel oxide windows 95 that are substantially larger than the tunnel oxide windows 65 of the present invention. The prior art cell also has a floating gate 98, sense gate 100 and control gate 105 that are larger than the floating gate 70, sense gate 75 and control gates 80 of the present invention.

Thus the present invention allows not only smaller EEPROM tunnel oxide windows than the prior art, with the improvements in performance previously described, but also allows the whole EEPROM cell to be scaled to a smaller size which allows more EEPROM cells to be packed together.

Figure 9:
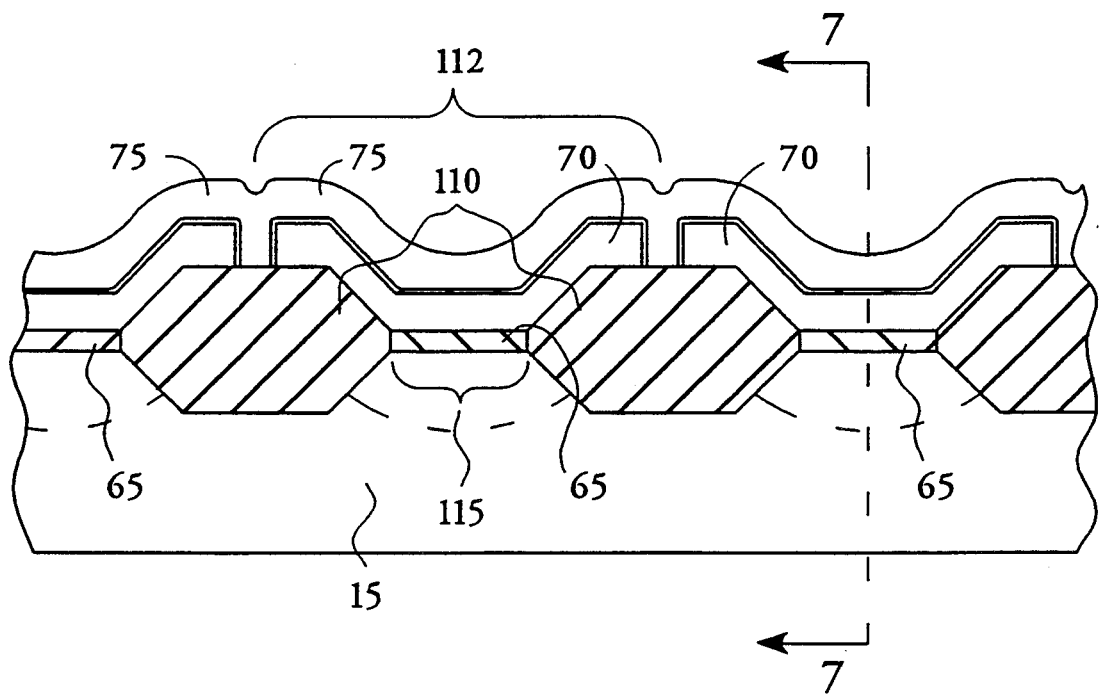
FIG. 9 is a perpendicular cross-sectional elevation view of an EEPROM device constructed in accordance with this invention.

In FIG. 9 field oxide regions 110 separating each cell 112 were grown by conventional techniques onto and into the substrate 15 before the growth or deposit of first oxide layer 25. The distance 115 between those field oxide regions 110 determines one dimension of the tunnel window 65, and may be a thousand to ten thousand angstroms. The floating gates 70 can be seen to contour upward away from the tunnel window 65 to fit on top of the field oxide regions 110, and the sense gates 75 are similarly contoured. The sense gates 75 wrap around ends of the floating gates 70, in order to increase the capacitive coupling between these gates.

Thus, the tunnel oxide windows 65 may be less than one hundred angstroms in thickness, and may be as small as one thousand angstroms in each dimension of area, a substantial decrease in size compared to the prior art.

In the present invention, the dimensions of the thin oxide tunneling window have been characterized as being smaller than dimensions resolvable by photolithography. The photolithography which is referred to is carried out at optical wavelengths using diffraction limited optics. No reference is intended to x-ray lithography which can resolve distances much smaller than the distance resolved by conventional photolithography. Such reference or comparison is not intended because the thin oxide windows of the present invention have not been measured relative to such distances.

We claim:

1. A method for forming a dielectric tunneling window in an EEPROM device comprising:

patterning an oxide layer over a substrate by photolithography, edges of the oxide layer defining the sides of an EEPROM tunneling window, masking said window with an etchable mask, etching under the mask a distance so that at least two sides of said window are spaced apart by a distance less than that resolvable with photolithography, forming an oxide layer surrounding the tunneling window, to form a window oxide in said EEPROM tunneling window removing said mask material, thinning all remaining oxide, including the window oxide, to the extent that the window oxide is removed, and growing a layer of oxide over the substrate.

2. The method of claim 1 wherein said patterning step comprises forming some sides of the window on a silicon substrate, said masking step comprises depositing a first nitride layer on top of said first oxide layer, and said etching step comprises etching away portions of said first nitride layer.

3. The method of claim 2 wherein etching away portions of said first nitride layer includes etching away areas of said first oxide layer not protected by said first nitride layer and also etching said first oxide layer under portions of said first nitride layer.

4. The method of claim 3 wherein said forming of an oxide layer surrounding the tunneling window comprises:

growing on said substrate a second oxide layer that is thinner than said first oxide layer, said second oxide layer extending under said portions of the nitride layer to cover said substrate where said first oxide layer has been etched away, leaving a space between said portions and said second oxide layer, depositing on said first nitride layer and said second oxide layer a second nitride layer that fills in said space between said ends and said second oxide layer, etching away substantially all of said second nitride layer except said second nitride layer filling said space between said ends and said second oxide layer; which is protected from etching by outer areas of said second nitride layer, growing a third oxide layer on said second oxide layer that is not covered by nitride, stripping away all nitride, applying an oxide etch that removes part of said first oxide layer, all of said second oxide layer and part of said third oxide layer, the substrate being exposed where said second oxide layer is completely removed, and forming a fourth oxide layer, resulting in an oxide layer where the substrate had been exposed and a thicker oxide layer elsewhere.

5. The method of claim 4 wherein field oxide regions are grown on said substrate prior to forming a first oxide layer on the substrate, whereby said field oxide regions form borders of a device containing said window.

6. A method for forming a dielectric tunneling window in an EEPROM device comprising:

depositing a first mask layer having a pattern in an oxide layer covered by the mask layer establishing at least two sides of a four sided oxide window, undercutting the mask while etching away the first oxide layer to the substrate, depositing over the substrate a second oxide layer thinner than the first oxide layer, including in the undercut region, masking the undercut region with a blanket second mask layer etched away except in the undercut region, thickening the second oxide layer to a thickness at least as thick as the first oxide layer, removing all mask layers, etching the oxide layers, including the previously masked four sided oxide window until the oxide of the window is completely removed, and growing over the substrate including the window region a third oxide layer so that only the third oxide layer resides in the window.

7. The method of claim 6 wherein said undercut region is formed at a distance relative to the other sides less than any distance resolvable by photolithography and oxide etching.

8. The method of claim 6 further defined by completing an EEPROM transistor by depositing poly one and poly two layers over the third oxide layer and forming spaced apart doped regions in the substrate.

9. A method of forming a small window for electron tunneling in an EEPROM transistor comprising:

forming a first oxide layer on a silicon substrate having subsurface regions defined for source and drain electrodes, depositing a first nitride layer on top of said first oxide layer, etching away part of said first nitride layer, leaving ends of said first nitride layer located above said regions defined for source and drain electrodes, etching away said first oxide layer which is not covered by remaining said first nitride layer and also etching said first oxide layer under said ends of said first nitride layer, growing on said substrate a second oxide layer that is thinner than said first oxide layer, said second oxide layer extending under said ends to cover said substrate where said first oxide layer has been etched away, leaving a space between said ends and said second oxide layer, depositing on said first nitride layer and said second oxide layer a second nitride layer that fills in said space between said ends and said second oxide layer, etching away all of said second nitride layer except said second nitride layer filling said space between said ends and said second oxide layer, which is protected from etching by outer areas of said second nitride layer, growing a third oxide layer on said second oxide layer that is not covered by nitride, stripping away all nitride, applying an oxide etch that etches away part of said first oxide layer, all of said second oxide layer and part of said third oxide layer, the substrate being exposed where said second oxide layer is completely removed, forming a fourth oxide layer, resulting in only the oxide layer where the substrate had been exposed and a thicker oxide layer elsewhere, and depositing a polycrystalline silicon gate layer on said fourth oxide layer, whereby said polycrystalline silicon gate is separated from said substrate by oxide, said gate having a downward projection into said recess that is separated from said substrate by said fourth oxide layer, which becomes a window for electron tunneling between said gate and one of the source and drain electrodes in said substrate.

10. A method of forming a small window for electron tunneling in an EEPROM comprising:

growing field oxide regions on a surface of a silicon substrate that are separated by a strip of said surface where field oxide is not grown, said strip having subsurface regions of implanted ions, forming a first oxide layer on said strip and field oxide regions, depositing a first nitride layer top of said first oxide layer, etching away some areas but not others of said first nitride layer, defining ends of remaining said first nitride layer that are located over said regions of implanted ions, etching away areas of said first oxide layer not covered by remaining said first nitride layer and also etching said first oxide layer under said ends of said first nitride layer, growing on said substrate a second oxide layer that is thinner than said first oxide layer, said second oxide layer extending under said ends to cover said substrate where said first oxide layer has been etched away, leaving a space between said ends and said second oxide layer, depositing on said first nitride layer and said second oxide layer a second nitride layer that fills in said space between said ends and said second oxide layer, etching away all of said second nitride layer except said second nitride layer filling said space between said ends and said second oxide layer, which is protected from etching by outer areas of said second nitride layer, growing a third oxide layer on said second oxide layer that is not covered by nitride, stripping away all nitride, applying an oxide etch that etches away part of said first oxide layer, all of said second oxide layer and part of said third oxide layer, the substrate being exposed where said second oxide layer is completely removed, p1 forming a fourth oxide layer, resulting in a oxide layer where the substrate had been exposed and a thicker oxide layer elsewhere, and depositing a polycrystalline silicon first gate layer on said fourth oxide layer, whereby said first gate layer has a bottom surface with a downward projection where the substrate had been exposed, said projection separated from said substrate by only said fourth oxide layer, which becomes a window for electron tunneling between said gate and said substrate.

11. The method of claim 10 wherein said field oxide regions are formed in generally parallel rows and said ends of remaining said first nitride layer are generally transverse to said rows of field oxide regions, whereby an array of said EEPROMs is formed.

* * * * *

UNITED STATES PATENT AND TRADEMARK OFFICE
CERTIFICATE OF CORRECTION

PATENT NO. : 5,352,618
DATED : October 4, 1994
INVENTOR(S) : Bradley J. Larsen et al.

It is certified that error appears in the above-indentified patent and that said Letters Patent is hereby corrected as shown below:

```
Col. 1, line 36, "between 70 angsttoms" should read
     - -between 70 angstroms- -; lines 51-52, "related to the
     both the area" should read - -related to both the area- -.
Col. 2, line 68, "approximately 100 angsttoms" should read
     - -approximately 100 angstroms- -.
Col. 3, line 14, "approximately 700 angsttoms" should read
     - -approximately 700 angstroms- -.
Col. 4, lines 38-39, "that not covered" should read
     - -that is not covered- -.
Column 5, line 31, "is shown ill" should read - -is shown in- -.
Claim 10, column 8, line 20 "a first nitride layer top of"
     should read - -a first nitride layer on top of- -.
Claim 10, column 8, line 52, delete beginning with "p1" to and
     including line 55 "and" and insert the following
     subparagraph:  - -forming a fourth oxide layer, resulting in
     an oxide layer where the substrate had been exposed and a
     thicker oxide layer elsewhere, and- -.
```

Signed and Sealed this

Seventh Day of March, 1995

*Attest:*

BRUCE LEHMAN

*Attesting Officer*  *Commissioner of Patents and Trademarks*